(12) United States Patent
Duvillaret et al.

(10) Patent No.: US 9,810,728 B2
(45) Date of Patent: Nov. 7, 2017

(54) VOLTAGE MEASURING DEVICE

(71) Applicants: KAPTEOS, Le Bourget-du-Lac (FR); ELECTRICITE DE FRANCE, Paris (FR)

(72) Inventors: Lionel Duvillaret, Chambery (FR); Gwenaël Gaborit, Saint Alban Leysse (FR); Frédéric Lecoche, Le Bourget-du-Lac (FR); Gilbert Schmitt, Poligny (FR); Anne Grau, Ecuelles (FR)

(73) Assignees: KAPTEOS, Le Bourget-du-Lac (FR); ELECTRICITE DE FRANCE, Paris (FR)

( * ) Notice: Subject to any disclaimer, the term of this patent is extended or adjusted under 35 U.S.C. 154(b) by 40 days.

(21) Appl. No.: 14/894,038

(22) PCT Filed: May 28, 2014

(86) PCT No.: PCT/FR2014/051278
§ 371 (c)(1),
(2) Date: Nov. 25, 2015

(87) PCT Pub. No.: WO2014/191695
PCT Pub. Date: Dec. 4, 2014

(65) Prior Publication Data
US 2016/0116517 A1 Apr. 28, 2016

(30) Foreign Application Priority Data
May 31, 2013 (FR) .................................... 13 54984

(51) Int. Cl.
*G01R 29/12* (2006.01)
*G01R 19/00* (2006.01)
*G01R 15/16* (2006.01)

(52) U.S. Cl.
CPC .......... *G01R 29/12* (2013.01); *G01R 15/165* (2013.01); *G01R 19/0084* (2013.01);
(Continued)

(58) Field of Classification Search
CPC ................ G01R 19/00; G01R 19/0084; G01R 19/0092; G01R 15/12; G01R 15/14;
(Continued)

(56) References Cited

U.S. PATENT DOCUMENTS 5,473,244 A 12/1995 Libove et al.
6,998,832 B1 * 2/2006 McNulty .............. G01R 19/155 324/457

(Continued)

FOREIGN PATENT DOCUMENTS

WO 00/34793 A1 6/2008

OTHER PUBLICATIONS

Mitchell, N. "Stability Criteria for Cable-in-Conduit Superconducting Cables for Steady or Slow Pulse Operation," IEEE Transactions on Applied Superconductivity, vol. 14, No. 2, Jun. 1, 2004, pp. 1350-1355.

*Primary Examiner* — Hoai-An D Nguyen
(74) *Attorney, Agent, or Firm* — The Noblitt Group, PLLC (57) ABSTRACT

Methods and apparatus for measuring the voltage of at least one conductor (121, 122, 123) of an electrical power cable (10) comprise providing a container (22) made from a conductive material around a portion of the cable and at least one electric field sensor (301, 302, 303, 304) between the container and the cable and bringing the container to a constant potential and measuring the electric field with a sensor. The voltage is determined by comparing the measured electric field with electric fields simulated for a plurality of configurations of punctual electric charges.

10 Claims, 5 Drawing Sheets

(52) U.S. Cl.
   CPC .......... *G01R 15/16* (2013.01); *G01R 19/0061* (2013.01); *G01R 19/0092* (2013.01)

(58) Field of Classification Search
   CPC .. G01R 15/144; G01R 15/146; G01R 15/148; G01R 15/16; G01R 15/165; G01R 29/00; G01R 29/12
   USPC ..... 324/457, 522, 713, 76.11, 117 R, 117 H, 324/126; 702/1, 57, 64
   See application file for complete search history.

(56) References Cited

U.S. PATENT DOCUMENTS

| | | | |
|---|---|---|---|
| 7,755,347 B1 * | 7/2010 | Cullen | G01R 15/20 324/117 H |
| 2001/0024114 A1 * | 9/2001 | Kitagawa | G01R 19/0061 324/71.1 |
| 2014/0320125 A1 * | 10/2014 | Leeb | G01D 5/16 324/252 |

* cited by examiner

VOLTAGE MEASURING DEVICE

The present patent application claims the benefit of International Patent Application No. PCT/FR2014/051278, filed on May 28, 2014, which claims the priority benefit of French patent application FR13/54984, filed on May 31, 2013 which is herein incorporated by reference.

BACKGROUND

The present invention relates to a voltage measurement device and method, and more specifically to a device and a method for measuring the voltage in a power cable.

DISCUSSION OF THE RELATED ART

An electric power cable generally comprises at least one conductive wire, also called conductor, for example, three conductive wires. Each conductive wire may be surrounded with an insulating sheath, and the conductive wires with their insulating sheaths are maintained together in an insulating sleeve. As a variation, the conductive wires may be embedded in a single insulating sheath.

As an example, in a three-phase current power cable, the conductive wires transport sinusoidal currents having the same maximum amplitude and the same frequency, the phases of the currents being shifted from one conductive wire to the other, for example by 120°. As an example, for an industrial application, the effective voltage in each conductive wire may be in the range from 300 to 400 V.

It may be desirable to measure the voltage in each conductor of an electric power cable, for example, to determine whether the values of the effective voltages and the phase balancing are conformable. However, current voltage measurement devices require exposing each conductor of the cable and connecting a voltmeter to each exposed conductor.

It would thus be desirable to be able to measure the voltages of the conductors of an electric power cable while leaving the conductors in their insulating sheath.

SUMMARY

An object of an embodiment aims at providing a voltage measurement device and method which overcomes all or part of the disadvantages of usual voltage measurement devices.

According to another object of an embodiment, the measurements of the voltages of the conductors of the power cable may be performed without removing the insulating sheaths surrounding the conductors.

According to another object of an embodiment, the voltage measurement method may be implemented without knowing the number of conductors of the cable.

According to another object of an embodiment, the structure of the voltage measurement device is simple.

Thus, an embodiment of the present invention provides a method of measuring the voltage of at least one conductor of an electric power cable comprising the steps of:

arranging an enclosure of a conductive material around a portion of the cable and at least one electric field sensor between the enclosure and the cable;

taking the enclosure to a constant potential and measuring the electric field with the sensor; and determining said voltage based on the comparison of the measured electric field with simulated electric fields for a plurality of configurations of point electric charges.

According to an embodiment, the method further comprises the steps of:

determining by simulation the electric field obtained at the location of said sensor for a plurality of configurations of point electric charges corresponding to different positions of the point electric charges;

determining a criterion of comparison between the measured electric field and the simulated electric field for each configuration; and storing the configuration for which the comparison criterion is at an extremum.

According to an embodiment, the method comprises determining by simulation the electric field obtained at the location of said sensor for each configuration of a first set of configurations having a first number of point electric charges and for each configuration of a second set of configurations having a second number of point electric charges different from the first number.

According to an embodiment, the method comprises the steps of:

selecting at least one parameter from the group comprising the position of the center of the conductor with respect to the center of the cable, the mean radius of the conductor, the angular position of the conductor with respect to a reference axis, the phase of the voltage of the conductor, and the maximum amplitude of the voltage of the conductor;

varying the parameter between an initial value and a final value with a step; and determining the electric field obtained at the location of said sensor for each configuration of point electric charges associated with each value of the parameter.

According to an embodiment, the method comprises the steps of:

(a) determining the number of conductors of the cable based on the comparison of the measured electric field with the simulated electric fields for configurations of point electric charges comprising different numbers of point electric charges; and (b) determining said voltage based on the comparison of the measured electric field with the simulated electric fields for a plurality of configurations having the same number of point electric charges.

According to an embodiment, step (a) is carried out by varying, simultaneously for each conductor, at least one first parameter from said group and step (b) is carried out by varying, independently for each conductor, at least one second parameter from said group.

An embodiment also provides a device for measuring the voltage of at least one conductor of an electric power cable comprising:

an enclosure of a conductive material intended to be arranged around a portion of the cable and at least one electric field sensor intended to be arranged between the enclosure and the cable;

a source of a constant potential connected to the enclosure; and a processing unit capable of determining said voltage based on the comparison of the measured electric field with the simulated electric fields for a plurality of configurations of point electric charges.

According to an embodiment, the device comprises a plurality of electric field sensors.

According to an embodiment, the sensors are maintained in a tubular support of a dielectric material.

According to an embodiment, the device comprises at least one optical sensor measuring the electric field comprising an isotropic electro-optical crystal.

BRIEF DESCRIPTION OF THE DRAWINGS

The foregoing and other features and advantages of the present invention will be discussed in detail in the following non-limiting description of specific embodiments in connection with the accompanying drawings, among which.

DETAILED DESCRIPTION

For clarity, the same elements have been designated with the same reference numerals in the various drawings and, further, the various drawings are not to scale. In the following description, unless otherwise indicated, terms "substantially", "about", "approximately", and "in the order of" mean "to within 10%".

Figure 1:
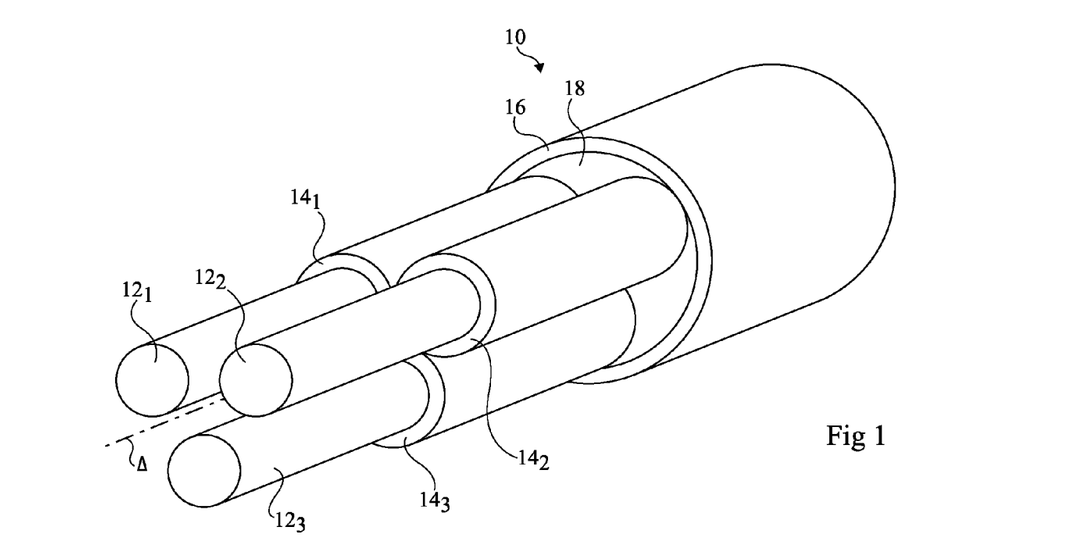
FIG. 1 is a cutaway view of an electric power cable.

FIG. 1 shows an example of a power cable 10 of axis Δ. Cable 10 comprises N conductors $12_i$, N being an integer greater than or equal to 1, for example varying from 1 to 10, preferably from 1 to 5, and i being an integer varying from 1 to N. In the example shown in FIG. 1, N is equal to three. Each conductor $12_i$, made of a metallic material, particularly based on copper or on aluminum, may correspond to a single wire or to an assembly of strands. Each conductor $12_i$ is surrounded with a sheath $14_i$ of a dielectric material. The three conductors 12 are maintained in an insulating sleeve 16, where the space between sleeve 16 and sheaths $14_i$ may be filled with an insulating filling material 18. The insulating materials forming sheaths $14_i$, sleeve 16, or filling material 18 may be identical or different.

As an example, each conductor $12_i$ has a circular or elliptic cross-section. However, each conductor $12_i$ may have a cross section of more complex shape, for example, an angular sector shape or an initially circular shape which has been more or less crushed. The cross-sections of conductors $12_i$ may be identical or different.

Figure 2:
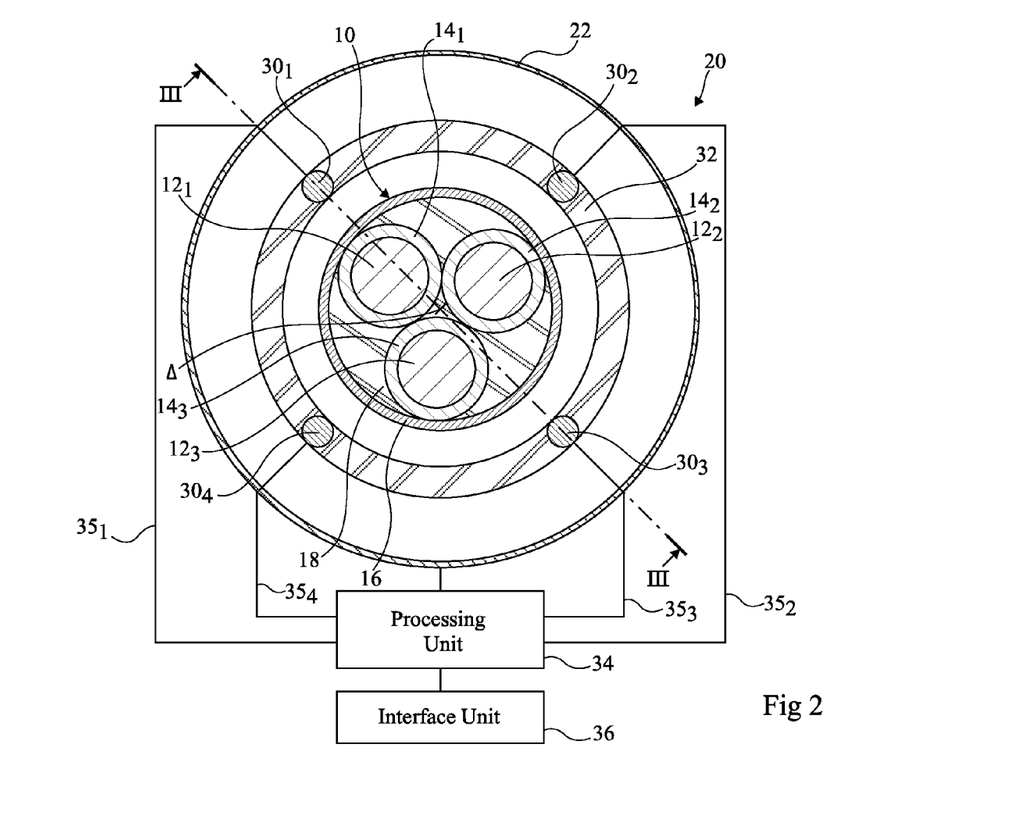
FIGS. 2 and 3 are cross-sections in two orthogonal planes of an embodiment of a device for measuring the voltage of a power cable.
Figure 3:
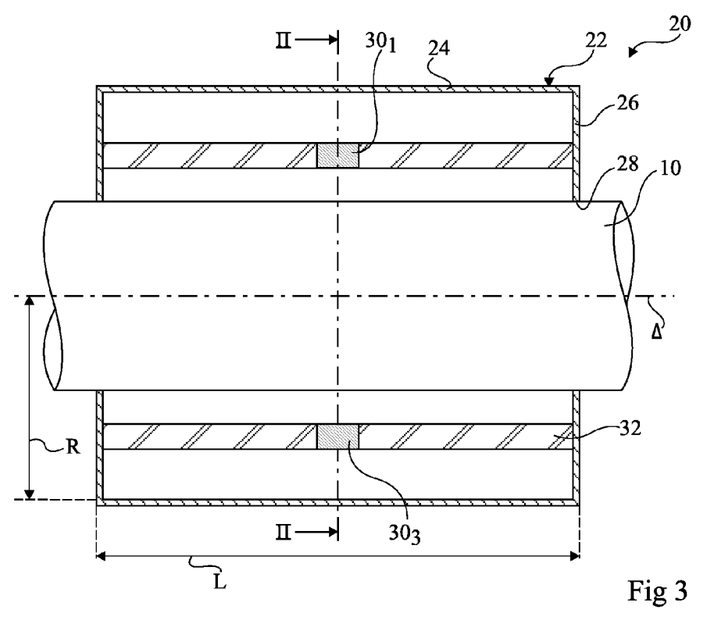

FIGS. 2 and 3 show an embodiment of a device 20 for measuring the voltages in conductors $12_i$ of power cable 10.

Device 20 comprises an enclosure 22, made of a conductive material, for example, nickel silver, and comprising a cylindrical portion 24 of axis Δ closed at its ends by ring-shaped portions 26. The internal wall of cylindrical portion 24 corresponds to a cylinder of axis Δ and of radius R. Length L measured along axis Δ is preferably strictly greater than R. Each ring-shaped portion 26 comprises a cylindrical opening 28 of axis Δ for the passing of cable 10.

Device 20 comprises M electric field sensors $30_k$ where M is an integer greater than or equal to 1, for example, varying from 1 to 8, and k is an integer varying from 1 to M. As an example, in FIG. 2, M is equal to four. Preferably, sensors $30_k$ are arranged in a plane perpendicular to axis Δ. As an example, sensors $30_k$ are arranged on a circle of axis Δ. Sensors $30_k$ are maintained by a support 32, made of a dielectric material. As an example, support 32 corresponds to a tube of axis Δ, attached to enclosure 20 at its ends and having sensors $30_k$ attached to its wall.

Device 20 further comprises a processing unit 34, only shown in FIG. 2, which is connected to each sensor $30_k$. Processing unit 34 for example comprises a processor and may correspond to a computer. Processing unit 34 may further comprise a non-volatile memory having a sequence of instructions which control the operation of processing unit 34 stored therein. As a variation, processing unit 34 may be formed by a dedicated electronic circuit.

Processing unit 34 is connected to each sensor $30_k$, with k varying from 1 to M, by one electric wire or more and/or by one optical fiber $35_k$ or more. Processing unit 34 is connected to an interface unit 36, for example comprising a display screen, a keyboard, a mouse, etc.

Device 20 enables to maintain cable 10 in position with respect to sensors $30_k$ and with respect to cylindrical portion 24. According to a variation, an intermediate part may be arranged inside of support 32 and between openings 28 to adapt to power cables 10 having different diameters. According to another variation, the holding of cable 10 is not ensured by enclosure 20, but by additional means which, when device 20 is installed on cable 10, enables to maintain constant the distance between cable 10 and sensors $30_k$ and between cable 10 and cylindrical portion 24.

Enclosure 22 may be formed of two half-enclosures mobile with respect to each other and support 32 may be formed of two half-supports, each half-support being connected to one of the half-enclosures. The two half-enclosures are for example connected to each other by a hinge connection. The mounting of measurement device 20 on cable 10 may then be performed by sandwiching cable 10 between the two half-enclosures which are temporarily attached to each other.

According to an embodiment, at least one of sensors $30_k$ comprises an optical sensor such as described in patent application U.S. Pat. No. 8,264,685.

According to another embodiment, at least one of sensors $30_k$ comprises a microelectromechanical system such as described in the publication entitled "Electric field sensor using electrostatic force deflection of a micro-spring supported membrane" by A. Roncin, C. Shafai, and D. R. Swatek or in the publication entitled "A Self-Resonant MEMS-based Electrostatic Field Sensor with 4V/m/√Hz Sensitivity" by T. Denison, J. Kuang, J. Shafran, M. Judy, and K. Lundberg.

According to an embodiment, sensor $30_k$ is an optical sensor comprising an electro-optical crystal. The thickness of the electro-optical crystal, measured along a direction parallel to axis Δ, may vary from 0.2 to 10 millimeters, preferably from 1 to 5 millimeters. As an example, the crystal is an isotropic electro-optical crystal. An isotropic electro-optical crystal is a crystal having isotropic optical properties in the absence of an electric field and having anisotropic optical properties in the presence of an electric field. The crystal may be zinc tellurium (ZnTe), cadmium tellurium (CdTe), cadmium zinc tellurium ($Cd_{1-x}Zn_xTe$) (x being capable of varying from 0.01 to 0.15), bismuth silicon oxide (BSO), gallium arsenide (AsGa), or indium phosphide (InP).

The thickness of support 32 may be substantially equal to the thickness of sensor $30_k$. As a variation, the thickness of support 32 may be greater than the thickness of sensor $30_k$, sensor $30_k$ being then embedded in support 32. The relative permittivity of the material forming support 32 is substantially equal to the relative permittivity of sensor $30_k$. As an example, when sensor $30_k$ corresponds to an electro-optical crystal, the electro-optical crystal and material 32 have a relative permittivity which may vary from 4 to 60, preferably from 7 to 15. The material forming support 32 may be a resin comprising a filler enabling to adjust the relative permittivity of support 32.

When sensor $30_k$ corresponds to an optical sensor comprising an electro-optical crystal, processing unit 34 may comprise a system for emitting a light beam towards the electro-optical crystal and a system for analyzing the light beam originating from the electro-optical crystal. The light beams may be transported between the crystal and the processing unit by optical fibers $35_k$.

When sensor $30_k$ corresponds to an optical sensor, its operating principle may be the following. The electric field present at the level of the electro-optical crystal varies certain optical properties of the crystal. The light beam crossing the crystal is thus modified. The modification of the light beam is detected by processing unit 34 which supplies signals representative of the amplitudes of the measured electric field components.

As an example, the dimensions of measurement device 20 are:
   inner diameter of cylindrical portion 24 of enclosure 20: 69 mm;
   thickness of cylindrical portion 24: 0.5 mm;
   diameter of opening 28: 30 mm;
   axial length of cylindrical portion 24: 100 mm;
   inner diameter of support 20: 30 mm; and
   outer diameter of support 20: 70 mm.

In the present embodiment, sensors $30_k$ are fixed with respect to enclosure 22. As a variation, it is possible for device 20 to comprise a single electric field sensor, or a decreased number of electric field sensors and to further comprise a system for displacing the electric field sensors with respect to cable 10 and/or to enclosure 22. It may be a system for pivoting the electric field sensor around cable 10 according to a circle of axis Δ.

Figure 4:
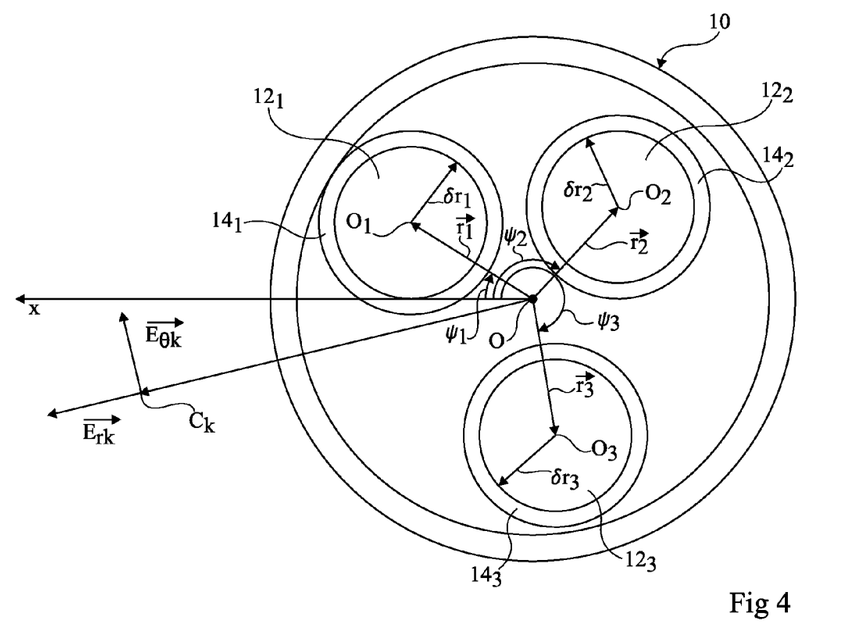
FIG. 4 illustrates parameters determined by the voltage measurement device.

FIG. 4 is a cross-section view in a plane perpendicular to axis Δ of cable 10 and illustrates certain parameters taken into account to implement an embodiment of the voltage measurement method. The cross-section plane of FIG. 4 is called measurement plane in the following description.

Point O corresponds to the intersection point between axis Δ of cable 10 and the cross-section plane of FIG. 4. Point O may correspond to the geometric center of the cross-section of cable 10, particularly to the center of symmetry of the cross-section when cable 10 has a circular, elliptic, rectangular cross-section, etc. Axis (Ox) corresponds to a reference axis. In the measurement plane, each conductor $12_i$ comprises a center $O_i$. Center $O_i$ corresponds to the geometric center of conductor $12_i$, particularly to the center of symmetry of the cross-section when conductor $12_i$ has a circular, elliptic, rectangular, etc. cross-section. Further, in the measurement plane, the cross-section of each conductor $12_i$ occupies a surface $S_i$. In the case where conductor $12_i$ has a circular cross-section, surface $S_i$ is a disk and point $O_i$ corresponds to the center of the disk. Call $\vec{r}_1$ the vector connecting point O to point $O_i$ and $\Psi_2$ the angle, measured clockwise, between axis (Ox) and vector $\vec{r}_2$. Further, call $\delta r_i$ the mean radius of conductor $12_i$. Mean radius $\delta r_i$ corresponds to the radius of conductor $12_i$ in the case where conductor $12_i$ has a circular cross-section and corresponds to the radius of the disk having the same surface area as conductor $12_i$ when conductor $12_i$ has a non-circular cross-section.

When voltages are applied to conductors $12_i$ of power cable 10, this translates as the occurrence of an electric field $\vec{E}$ at any point in space around cable 10, this electric field being time-variable in the case of variable voltages. Each sensor $30_k$ is capable of measuring the amplitude of electric field vector $\vec{E}_k$ at the location of sensor $30_k$ schematically designated by point $C_k$. The measurement plane comprises all the points $C_k$, k varying from 1 to M, a single point $C_k$ being shown in FIG. 4.

More specifically, each sensor $30_k$ is capable of measuring the amplitude of radial component $\vec{E}_{rk}$ of the electric field at the location of sensor $30_k$ and the amplitude of tangential component $\vec{E}_{\theta k}$ of the electric field at the location of sensor $30_k$. Radial component $\vec{E}_{rk}$ is the component of the electric field directed along line $(OC_k)$. Tangential component $\vec{E}_{\theta k}$ is the electric field component directed along the line perpendicular to line $(OC_k)$ in the cross-section plane of FIG. 4 and crossing point $C_k$. In the following description, the component of electric field $\vec{E}_k$ along Δ is neglected, since this component can be neglected as soon as the twist of the internal conductors has a pitch which is large as compared with the mean distance between point O and the center of conductors $O_i$.

According to an embodiment, to determine the voltage in each conductor $12_i$ with no contact with conductors $12_i$, processing unit 34 should determine voltage $V_i$ in each conductor $12_i$ from the measurements of electric field $\vec{E}_k$.

Voltages $V_i$ in conductors $12_i$, with i varying from 1 to N, cannot be directly determined Electric charge $Q_i$ in each conductor $12_i$ first has to be determined in the measurement plane, after which voltages $V_i$ have to be determined based on charges $Q_i$.

The determination of charges $Q_i$ based on electric fields $\vec{E}_k$ may theoretically be performed by using Gauss's theorem which can be written according to the following relation (1):

$$\oiint_S \vec{E} \cdot \vec{d^2S} = \frac{Q_{int}}{\varepsilon_0 \varepsilon_r} \tag{1}$$

where S is a closed surface, $Q_{int}$ is the electric charge inside of surface S, $\varepsilon_0$ is the permittivity of vacuum, and $\varepsilon_r$ is the relative permittivity of the medium at the level of surface S.

Further, the superposition principle provides that electric field $\vec{E}_k$ at point $C_k$ is equal to the sum of the electric fields due to each charge $Q_i$ considered separately and distributed on surface $S_i$ of each conductor $12_i$.

For an electric power cable, voltage $V_i$ may be searched for according to the following relation (2):

$$V_i = A_i \cos(\omega t + \phi_i) \tag{2}$$

where $A_i$ is the amplitude of voltage $V_i$, $\omega$ is the pulse of voltage $V_i$, and $\phi_i$ is the phase of voltage $V_i$. In the following description, call T the period of voltage $V_i$. Period T is equal to $2\pi/\omega$.

It can then be considered that linear charge $Q_i$ in conductor $12_i$ is proportional to voltage $V_i$ according to a proportionality factor $F_i$ which especially depends on the shapes of conductors $12_i$, on the relative positions between conductors $12_i$, and on the permittivity of the dielectric materials present in cable 10. When conductors $12_i$ are substantially identical and regularly distributed, proportionality factors $F_i$ may be identical and equal to a proportionality factor F.

In practice, the resolution of the previously-indicated equations $Q_i$ cannot be simply implemented in real time by a computer since many parameters are not known. Indeed, the exact shape of surface $S_i$ of each conductor $12_i$, the position of center $O_i$ of each conductor $12_i$ and the environment of cable 10 are not known at the time of the measurement. Now, the environment of cable 10, due to the presence of other conductors or of equipotential surfaces having any shape, may significantly modify the distribution of the electric field at the level of sensors $30_k$. Further, number N of conductors $12_i$ cannot be known at the time of the measurement.

The inventors have shown that, when a cylindrical enclosure is coaxially arranged around the power cable and when this enclosure is set to a reference potential, for example, the ground, electric field $\vec{E}$ present between the enclosure and conductors of the cable is substantially identical to the electric field due to positive and negative point electric charges, the positions and the values of these point charges especially depend on the number of conductors, on their positions, and on their shapes. Further, the distribution of the electric field at the level of sensors $30_k$ no longer depends on the environment external to device 20. A method of determining positions and values of point electric charges based on the previously-indicated equations may be implemented in real time by a computer or by means of a simple embarked calculator.

Figure 5:
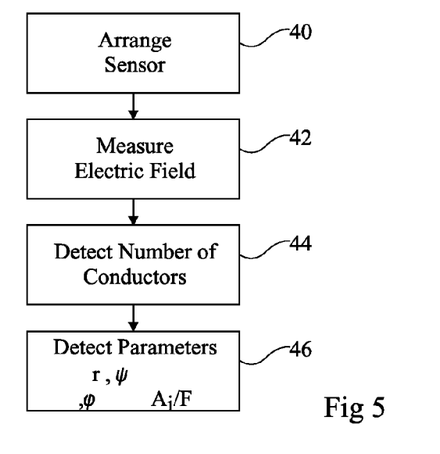
FIG. 5 shows in the form of a block diagram an embodiment of a voltage measurement method.

FIG. 5 shows in the form of a block diagram an embodiment of a voltage measurement method. The method comprises successive steps 40, 42, 44, and 46.

At step 40, measurement device 20 is arranged around cable 10 and enclosure 22 of measurement device 20 is taken to a reference potential, for example, the ground.

At step 42, processing unit 34 measures the amplitude of radial component $\vec{E}_{rk}$ and the amplitude of tangential component $\vec{E}_{\theta k}$ of electric field $\vec{E}_k$ at the location of each sensor $30_k$, with k varying from 1 to M. A plurality of measurements, for example, more than twenty measurements, are performed over a period T of oscillation of voltages $V_i$.

Figure 6:
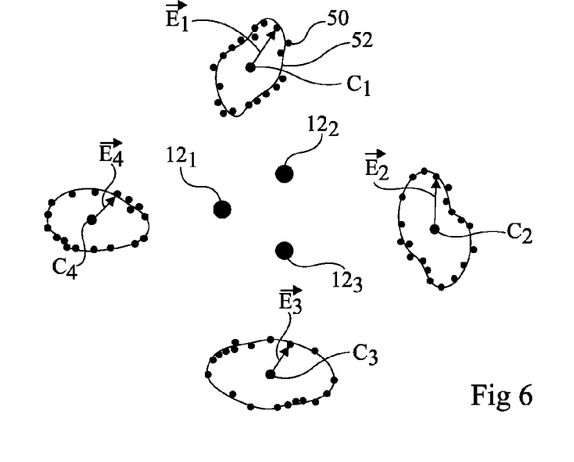
FIG. 6 shows an example of measurements of electric fields by the voltage measurement device according to the embodiment of FIGS. 2 and 3.

FIG. 6 shows an example of measurements of electric field by four sensors for a power cable comprising three conductors $12_1$, $12_2$, and $12_3$. FIG. 6 shows the centers $C_1$, $C_2$, $C_3$ and $C_4$ of the sensors and the positions of the end of electric field vector $\vec{E}_k$ applied to center $C_k$ at the measurement times during a period T. Curve 52 of the variation of the position of the end of electric field vector $\vec{E}_k$ obtained by interpolation has also been shown. As appears in FIG. 6, the end of each electric field $\vec{E}_k$ follows a curve having a general shape close to an ellipse.

At steps 44 and 46, processing unit 34 uses electric models equivalent to the assembly formed by conductors $12_i$ and enclosure 22.

Figure 10:
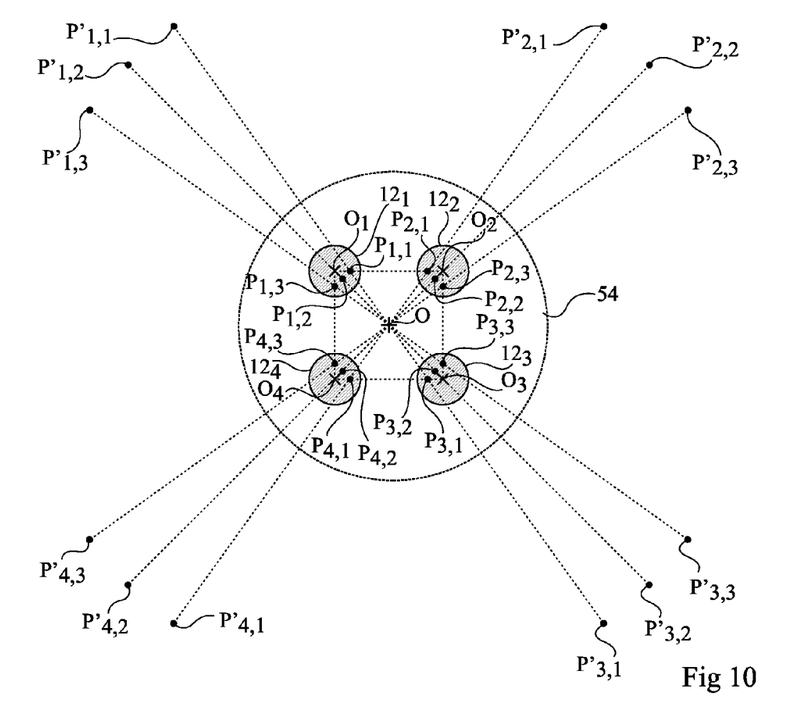

FIGS. 7 to 10 show conductors $12_i$ with hatched circles, respectively for a cable 10 comprising a single conductor $12_1$ (FIG. 7), two conductors $12_1$ and $12_2$ (FIG. 8), three conductors $12_1$, $12_2$, and $12_3$ (FIG. 9), and four conductors $12_1$, $12_2$, $12_3$, and $12_4$ (FIG. 10). Enclosure 22 of measurement 20 is further shown by a circle 54 in dotted lines of radius R in these drawings. Each of FIGS. 7 to 10 further shows the electric model based on point electric charges, which is equivalent to the assembly comprising conductors $12_i$ and enclosure 22 maintained at a reference potential.

Figure 7:
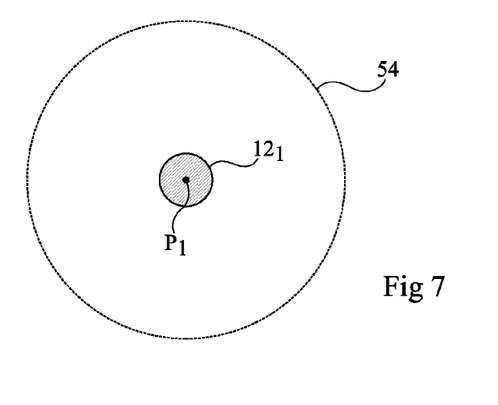
FIGS. 7 to 10 show different structures of electric power cables and the equivalent electrical models implemented by the embodiment of the voltage measurement method illustrated in FIG. 5.
Figure 8:
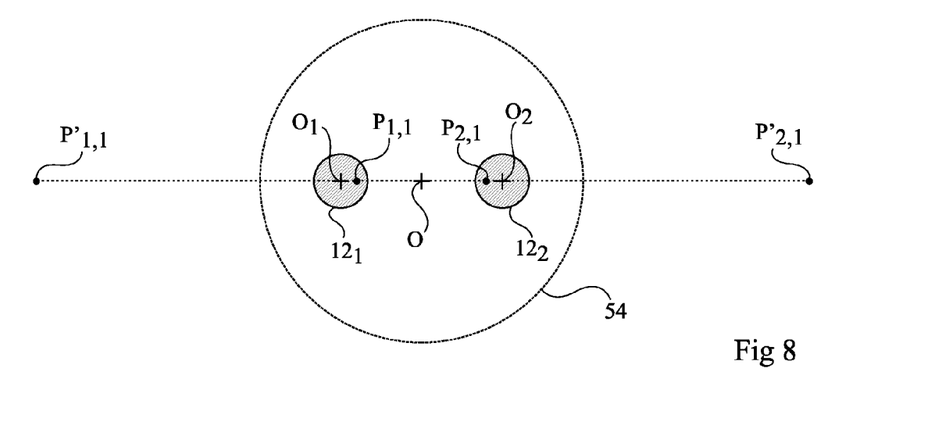
Figure 9:
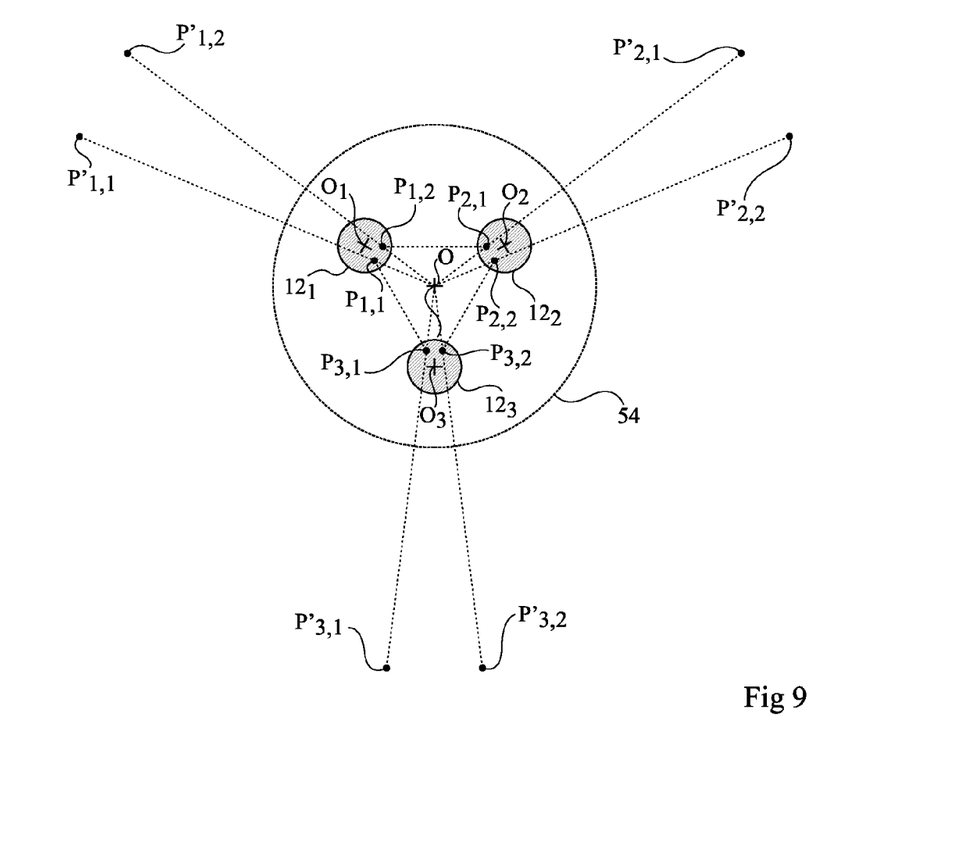

In FIG. 7, when cable 10 comprises a single conductor $12_1$, the equivalent electric model comprises a single point electric charge $P_1$, having electric charge $Q_1$, placed at center $O_1$ of conductor $12_1$. More generally, for an electric cable 10 comprising N conductors, with N greater than 1, the electric model equivalent to the assembly comprising electric conductors $12_i$ and enclosure 22 maintained at a reference potential comprises a number 2N(N-1) of point charges. More specifically, electric conductor $12_i$, for i varying from 1 to N, has N-1 associated point charges $P_{i,u}$ and N-1 associated point image charges $P'_{i,u}$, where u is an integer varying from 1 to N-1. Each point charge $P_{i,u}$ has an electric charge equal to a fraction of $Q_i$, the sum of electric charges $P_{i,u}$ associated with a same electric conductor $12_i$ being equal to $Q_i$. Each image point charge $P'_{i,u}$ has an electric charge equal, in absolute value, to electric charge $P_{i,u}$ and of opposite sign.

The point charges are arranged so that curve 54 corresponds to an equipotential line. FIGS. 7 to 10 illustrate the principles for determining the positions of the point charges. In particular, certain point charges are placed on the lines connecting the centers of adjacent conductors. Further, as compared with point charge $P_{i,u}$, image point charge $P'_{i,u}$ is arranged so that distance $OP'_{i,u}$ verifies the following relation (3):

$$OP'_{i,u} = \frac{R^2}{OP_{i,u}} \qquad (3)$$

At step 44, processing unit 34 determines number N of conductors $12_i$ of the cable when this number is not known. Processing unit 34 successively uses the electric model equivalent to a single conductor, the electric model equivalent to two conductors, the electric model equivalent to three conductors, etc.

Further, conditions linking the parameters of the equivalent electric models are used to simplify calculations. It is especially considered that:
  (i) conductors $12_i$ are identical, of circular cross-section, and of same radius $\delta r$;
  (ii) centers $O_i$ of the conductors are at the same distance r from center O;
  (iii) conductors $12_i$ are regularly distributed around center O of cable 10;
  (iv) amplitudes $F*A_i$ are identical;
  (v) phases $\phi_i$ are linked by a relation which depends on the number of conductors $12_i$; and
  (vi) when cable 10 comprises more than four conductors $12_i$, the potential of at least one of the conductors is constant and set to 0 V.

Condition (i) particularly means that weighting factors $F_i$ are identical and equal to F. Condition (iii) means, particularly in the case of a cable 10 comprising two conductors $12_1$ and $12_2$, that these conductors are arranged symmetrically with respect to center O and, in the case of a cable 10 comprising three conductors $12_1$, $12_2$ and $12_3$, that these conductors are arranged at 120° with respect to one another around center O and at a same distance from center O. Condition (v) for example means that in the case of a cable with three conductors $12_1$, $12_2$ and $12_3$, phases $\phi_1$, $\phi_2$ and $\phi_3$ are shifted with respect to one another by 120°.

For each equivalent electric model, processing unit 34 independently varies the following parameters between an initial value and a final value with an incrementation step:
distance r;
angle $\Psi_1$; and
amplitude $F^*A_1$.

In each obtained configuration, processing unit 34 determines the curve of variation of the electric field obtained at centers $C_k$, with k varying from 1 to M, of each sensor during a period T. Processing unit 34 then compares the simulated curve obtained for sensor $30_k$ with the curve measured at step 42 for sensor $30_k$ and determines a comparison criterion for the configuration. As an example, processing unit 34 determines, for each sensor $30_k$, the mean square error between the measured curve and the simulated curve or other criteria such as the average absolute error, the average relative quadratic error, or also Pearson's correlation coefficient. The comparison criterion for the configuration is for example equal to the sum of the mean square errors for each sensor.

Processing unit 34 determines that number N of conductors of cable 10 is the number of conductors of the configuration for which the comparison criterion is minimum. It is the configuration for which the measured curves are as close as possible to the simulated curves.

Processing unit 34 keeps in a memory the values of parameters r, $\Psi_1$ and $F^*A_1$ for which the comparison criterion is minimum. These values are respectively noted $r_{INI}$, $\Psi_{INI1}$ and $F^*A_{INI1}$. Further, in the case shown in FIG. 4, value $\Psi_{INI1}$ sets values $\Psi_{INI2}$ and $\Psi_{INI3}$.

At step 44, if number N of conductors $12_i$ of cable 10 is already known, the operator performing the measurement may indicate this number N to processing unit 34 via interface unit 36. Processing unit 34 may then independently vary parameters r, $\Psi_1$, and $F^*A_1$ only for the equivalent electric model corresponding to the known number N of conductors.

At step 46, processing unit 34 uses the configuration determined at step 44 for which the comparison criterion is minimum.

Processing unit 34 modifies the equivalent electric model of this configuration by independently varying the following parameters, for each conductor $12_i$, between an initial value and a final value with an incrementation step:
distance $r_i$;
angle $\Psi_i$;
radius $\delta r_i$;
amplitude $F^*A_1$; and
phase $\phi_i$.

As a variation, for some of the previously-indicated parameters, and particularly radius $\delta r_i$, the parameter may be simultaneously modified, and possibly identically, for all conductors $12_i$.

As an example, in relation with the example shown in FIG. 4, processing unit 34 may vary, independently for each conductor, parameters $r_i$, $F^*A_i$, $\Psi_1$, $\Psi_2$, $\Psi_3$ respectively around values $r_{INI}$, $F^*A_{INI1}$, $\Psi_{INI1}$, $\Psi_{INI2}$, and $\Psi_{INI3}$ determined at step 44.

In each obtained configuration, processing unit 34 determined the curve of variation of the electric field obtained at centers $C_k$, with k varying from 1 to M, of each sensor during a period T.

Figure 11:
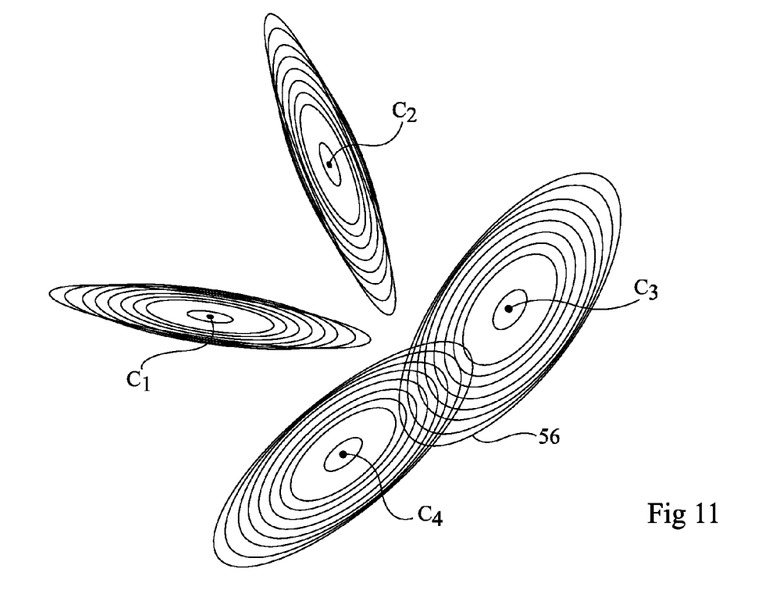
FIG. 11 shows an example of simulations of electric fields implemented by the embodiment of the voltage measurement method illustrated in FIG. 5.

FIG. 11 shows an example of simulations of the electric fields $\vec{E}_k$ at centers $C_1$, $C_2$, $C_3$ and $C_4$ of four sensors for a cable 10 comprising three conductors. FIG. 6 shows curves 56 followed by the end of electric field vector $\vec{E}_k$ applied to center $C_k$ during a period T for values of parameters $\delta r_i/r_i$ varying from 0.1 to 0.8 for i varying from 1 to 3.

Processing unit 14 then compares the simulated curve obtained for sensor $30_k$ with the curve measured at step 42 for sensor $30_k$ and determines a comparison criterion for the configuration. As an example, processing unit 14 determines for each sensor $30_k$ the mean square error between the measured curve and the simulated curve. The comparison criterion for the configuration is for example equal to the sum of the mean square errors for each sensor.

Processing unit 34 keeps in a memory the values, for each conductor $12_i$, with i varying from 1 to N, of parameters $r_i$, $\Psi_i$, $\delta r_i$, $F^*A_i$ and $\phi_i$ for which the comparison criterion is minimum. These values are respectively noted $r_{FINi}$, $\Psi_{FINi}$, $\delta r_{FINi}$, $F^*A_{FINi}$, and $\phi_{FINi}$. Processing unit 34 may provide the operator, via interface unit 36, with values $r_{FINi}$, $\Psi_{FINi}$, $\delta r_{FINi}$, $F^*A_{FINi}$ and $\phi_{FINi}$, with i varying from 1 to N.

To display the time variation of voltage $V_i$, it is necessary to have proportionality factors $F_i$ for each conductor $12_i$. Proportionality factors $F_i$ may be obtained by a previous step of calibration of cable 10 and may be stored in a non-volatile memory of processing unit 34. As an example, a list of weighting factors may be stored in the non-volatile memory of processing unit 34, each weighting factor corresponding to a specific type of power cable. The operation may then select the values of proportionality factors $F_i$ by using interface unit 36. Even if proportionality factor $F_i$ is not known, measurement device 20 provides for each conductor $12_i$ a signal which is proportional to voltage $V_i$. This signal may then be used to verify the proper operation of cable 10.

The invention claimed is:

1. A method of measuring the voltage of at least one conductor of an electric power cable comprising the steps of:
arranging an enclosure of a conductive material around a portion of the cable and at least one electric field sensor between the enclosure and the cable;
taking the enclosure to a constant potential and measuring the electric field with the sensor; and
determining said voltage based on the comparison of the measured electric field with simulated electric fields for a plurality of configurations of point electric charges within the cable.

2. The method of claim 1, further comprising the steps of:
determining by simulation the electric field obtained at the location of said sensor for a plurality of configurations of point electric charges corresponding to different positions of the point electric charges;
determining a criterion of comparison between the electric field and the simulated electric field for each configuration; and
storing the configuration for which the comparison criterion is at an extremum.

3. The method of claim 2, comprising determining by simulation the electric field obtained at the location of said sensor for each configuration of a first set of configurations having a first number of point electric charges and for each configuration of a second set of configurations having a second number of point electric charges different from the first number.

4. The method of claim 2, further comprising the steps of:
selecting at least one parameter from the group comprising the position of the center of the conductor with respect to the center of the cable, the average radius of the conductor, the angular position of the conductor with respect to a reference axis, the phase of the voltage of the conductor, and the maximum amplitude of the voltage of the conductor;

varying the parameter between an initial value and a final value with a step; and determining by simulation the electric field obtained at the location of said sensor for each configuration of point electric charges associated with each value of the parameter.

5. The method of claim 2, further comprising the steps of:
(a) determining the number of conductors of the cable based on the comparison of the measured electric field with the simulated electric fields for configurations of point electric charges comprising different numbers of point electric charges; and
(b) determining said voltage based on the comparison of the measured electric field with the simulated electric fields for a plurality of configurations having the same number of point electric charges.

6. The method of claim 5, wherein step (a) is carried out by varying, simultaneously for each conductor, at least one first parameter from said group and wherein step (b) is carried out by varying, independently for each conductor, at least one second parameter from said group.

7. A device for measuring the voltage of at least one conductor of an electric power cable comprising:
an enclosure of a conductive material intended to be arranged around a portion of the cable and at least one electric field sensor intended to be arranged between the enclosure and the cable;
a source of a constant potential connected to the enclosure; and
a processing unit capable of determining said voltage based on the comparison of a measured electric field obtained with the electric field sensor with simulated electric fields produced by the electric field sensor, for a plurality of configurations of point electric charges within the cable.

8. The device of claim 7, comprising a plurality of electric field sensors.

9. The device of claim 8, wherein the sensors are maintained in a tubular support of a dielectric material.

10. The device of claim 7, comprising at least one optical sensor measuring the electric field comprising an isotropic electro-optical crystal.

* * * * *